United States Patent [19]
Tani et al.

[11] Patent Number: 5,972,562
[45] Date of Patent: *Oct. 26, 1999

[54] VISIBLE RADIATION-CURABLE SOLDER RESIST COMPOSITIONS, AND METHOD FOR FORMING SOLDER RESIST PATTERNS

[75] Inventors: Motoaki Tani; Hiroyuki Machida; Nobuyuki Hayashi, all of Kanagawa, Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/819,804

[22] Filed: Mar. 18, 1997

[30] Foreign Application Priority Data

Aug. 20, 1996 [JP] Japan .................................. 8-218838
Feb. 14, 1997 [JP] Japan .................................. 9-030690

[51] Int. Cl.$^6$ ........................................................ G03C 1/73
[52] U.S. Cl. .................................. 430/280.1; 430/285.1; 430/287.1; 430/288.1; 430/913; 430/915; 430/920; 522/26; 522/24; 522/142; 522/16

[58] Field of Search .............................. 430/286.1, 281.1, 430/280.1, 285.1, 287.1, 288.1, 913, 915, 920; 522/26, 142, 24, 46, 16

[56] References Cited

U.S. PATENT DOCUMENTS

| | | | |
|---|---|---|---|
| 4,247,619 | 1/1981 | Cohen et al. | 430/286.1 |
| 4,271,259 | 6/1981 | Breslow et al. | 430/286.1 |
| 4,962,011 | 10/1990 | Aldag et al. | 430/281.1 |

*Primary Examiner*—Maria Nuzzolillo
*Assistant Examiner*—Laura Weiner
*Attorney, Agent, or Firm*—Armstrong, Westerman, Hattori, McLeland & Naughton

[57] ABSTRACT

A visible radiation-curable solder resist composition which comprises a resin component, a component for promoting photo-polymerization or -crosslinking, and optionally a diluent and any other additives, the resion componebt comprising a novolak resin skeleton and a polyfunctional acrylic monomer and the component for promoting photo-polymerization or -crosslinking comprising a photo-reaction initiator, a sensitizing dye and a heterocyclic compound having at least two endocyclic nitrogen atoms.

11 Claims, 1 Drawing Sheet

VISIBLE RADIATION-CURABLE SOLDER RESIST COMPOSITIONS, AND METHOD FOR FORMING SOLDER RESIST PATTERNS

BACKGROUND OF THE INVENTION

1. Field of the Invention

The present invention relates to visible radiation-curable solder resist compositions and a method for forming solder resist patterns. More precisely, it relates to visible radiation-curable solder resist compositions for forming protective films, which are to form protective films over the regions to be protected or insulated in, for example, printed circuit boards with conductor circuits formed thereon, for the purpose of protecting the conductive metals in said printed circuit boards from being oxidized and for the purpose of electrically insulating said conductive metals therein, and relates to a method for forming solder resist patterns for said purposes.

2. Related Art

Two conventional patterning methods are known, one being a screen-printing method and the other being a photo-printing method using ultraviolet rays.

The screen-printing method is advantageous in that its producibility is high and that it is inexpensive, but is disadvantageous in that its printing accuracy and reproducibility are poor thereby limiting the printable latitude to a line width of 0.2 mm or thicker.

The photo-printing method using ultraviolet rays is advantageous in that its printing accuracy and reproducibility are good, but is disadvantageous in that its producibility is low. In addition, as using ultraviolet rays, this method is problematic in the following points.

Photosensitive compositions are used in the conventional photo-printing method, while serving plenty of uses for, for example, photoresists, photolithographic and photoengraving materials, PS plate materials for offset printing, information-recording insulating materials, and solder resists. Many of such photosensitive compositions are sensitive to ultraviolet rays. However, since their sensitivity is very small to fall generally between several tens and several hundreds mJ/cm², they require high-power light sources. In addition, in the photo-printing method, masks are used for the exposure to ultraviolet rays, since the energy conversion in the UV exposure is poor.

On the other hand, another imaging method is known, which uses laser rays having a high energy density for directly forming images. This method is advantageous in that the energy conversion therein is good and that the imaging step constituting it can be significantly simplified.

It is desirable to use visible lasers having a longer life and having more stable light intensity than ultraviolet lasers, as scanning exposure sources for direct imaging. Therefore, desired are visible radiation-curable compositions that are sensitive to scanning exposure to visible lasers.

To meet this demand, for example, a photolithographic material sensitive to visible rays has been reported in Japanese Patent Application Laid-Open No. 62-31848; a high-sensitivity photopolymerizable composition comprising a photopolymerization initiator, which is sensitive even to low-intensity ultraviolet rays and visible rays and which can be exposed even to lasers, has been reported in Japanese Patent Application Laid-Open No. 61-233736; and a polymerizable composition which is sensitive to not only ultraviolet rays but also visible rays, especially to light near to 500 nm has been reported in Japanese Patent Application Laid-Open No. 60-221403.

Given the situation as above, there is now another demand for visible radiation-curable solder resist compositions which are sensitive to scanning exposure to visible lasers and which are applicable to the formation of thick films of solder resists. For example, Japanese Patent Application Laid-Open No. 3-179064 discloses a visible radiation-curable resin composition. The composition disclosed therein is used for forming relatively thin etching patterns, and this is removed after etching. However, there is not known any practicable, visible radiation-curable resin composition which can form relatively thick solder resist patterns.

Patterning of solder resists is generally conducted according to a screen-printing method, or to a photo-printing method where an ultraviolet-curable solder resist composition (see, for example, Japanese Patent Application Laid-Open No. 1-141904, and Japanese Patent Publication No. 1-54390) is exposed to ultraviolet rays. However, as mentioned hereinabove, these methods are problematic in various points.

SUMMARY OF THE INVENTION

In consideration of the above-mentioned problems, the present inventors have studied to obtain solder resist compositions capable of being easily patterned through scanning exposure thereof to visible lasers, and as a result, have completed the present invention.

Therefore, according to the present invention, there is provided a visible radiation-curable solder resist composition which comprises a resin component, a component for promoting photo-polymerization or -crosslinking, and optionally a diluent and any other additives, the resin component comprising a novolak resin skeleton and a polyfunctional acrylic monomer and the component for promoting photo-polymerization or -crosslinking comprising a photo-reaction initiator, a sensitizing dye and a heterocyclic compound having at least two endocyclic nitrogen atoms.

In addition, according to the present invention, there is also provided a method for forming a solder resist pattern, which comprises applying the above-mentioned visible radiation-curable solder resist composition onto a substrate, exposing the substrate to visible rays only in the region in which a solder resist pattern is to be formed to thereby cure the solder resist composition in the thus-exposed region, then developing the solder resist composition to thereby dissolve the solder resist composition existing in the non-exposed region to remove and thereafter heat-treating the solder resist composition to form a solder resist pattern on the substrate.

DESCRIPTION OF PREFERRED EMBODIMENTS OF THE INVENTION

Figure 1:
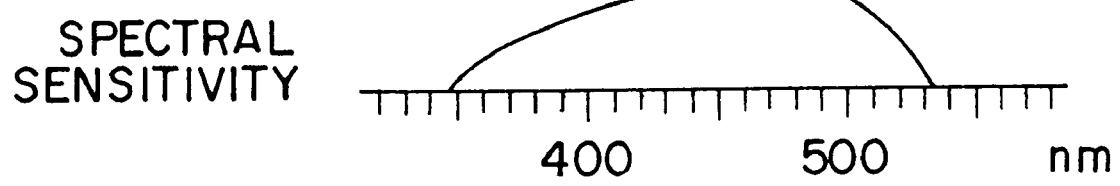
FIG. 1 shows a curve of the spectral sensitivity of the sensitizing dye used in Example 1.

The visible radiation-curable solder resist composition of the present invention comprises, as the resin component, a photo-curable epoxy resin having a novolak resin skeleton and a polyfunctional acrylic monomer.

The photo-curable epoxy resin having a novolak resin skeleton (hereinafter, this may be simply referred to as "photo-curable epoxy resin") is one that may be cured through photo-polymerization and/or -crosslinking to give a resin having an increased molecular weight. For this, employable herein is any and every known photo-curable epoxy resin. Concretely mentioned are various reaction products such as those mentioned below, which will function as so-called prepolymers, as being photo-polymerized and/or -crosslinked through exposure to visible rays to be cured.

(a) Completely or partially esterified products to be produced by the esterification of a novolak-type epoxy compound, at its epoxy group, with an unsaturated monocarboxylic acid; products to be produced by the reaction of said esterified product, which is produced by said esterification, with a saturated or unsaturated, polybasic acid anhydride at the secondary hydroxyl group of the former; and/or products to be produced by the reaction of a reaction product of a diisocyanate and a (meth)acrylate having at least one hydroxyl group in one molecule, with said esterified product at the secondary hydroxyl group of the latter (b) Completely or partially etherified products to be produced by the etherification of a novolak-type epoxy compound, at its epoxy group, with an unsaturated phenol compound; products to be produced by the reaction of said etherified product, which is produced by said etherification, with a saturated or unsaturated, polybasic acid anhydride at the secondary hydroxyl group of the former; and/or products to be produced by the reaction of a reaction product of a diisocyanate and a (meth)acrylate having at least one hydroxyl group in one molecule, with said etherified product at the secondary hydroxyl group of the latter These reaction products may be used herein either singly or as combined.

As the novolak-type epoxy compound, preferred are those as obtained by the reaction of novolaks, which are obtained by the reaction of phenols, such as phenol, cresol, halogenated phenols and alkylphenols, with formaldehyde in the presence of an acidic catalyst, with epichlorohydrin and/or methylepichlorohydrin. Concretely mentioned are YDCN-701, YDCN-704, YDPN-638 and YDPN-602, all produced by Toto Chemical Co.; DEN-431 and DEN-439, both produced by Dow Chemical Co.; EPN-1138, EPN-1235 and EPN-1299, all produced by Ciba-Geigy Co.; N-730, N-770, N-865, N-665, N-673, N-695, VH-4150, VH-4240 and VH-4440, all produced by Dai-Nippon Ink And Chemicals Co.; EOCN-120, EOCN-104 and BRRN-1020, all produced by Nippon Kayaku Co.; and ECN-265, ECN-293, ECN-285 and ECN-299, all produced by Asahi Chemical Industry Co.

If desired, the novolak-type epoxy compound may be partially or completely substituted with any of bisphenol A-type, bisphenol F-type, hydrogenated bisphenol A-type, brominated bisphenol A-type, amino group-containing, alicyclic or polybutadiene-modified glycidyl ether-type epoxy compounds, such as Epicote 828, Epicote 1007 and Epicote 807, all produced by Yuka-Shell Co.; Epiclon 840, Epiclon 860, Epiclon 3050 and Epiclon 830, all produced by Dai-Nippon Ink And Chemicals Co.; DER-330, DER-337, DER-361, DER-332, DER-662 and DER-542, all produced by Dow Chemical Co.; Celloxide 2021 and Celloxide 3000, both produced by Daisel Chemical Ltd.; TETRAD-X and TETRAD-C, both produced by Mitsubishi Gas Industries Chemical Co.; EPB-13 and EPB-27, both produced by Nippon Soda Co.; YD-116, YD-128, YD-013, YD-020, YDG-414, ST-3000, ST-110, YDF-190, YDF-2004 and YDF-2007, all produced by Toto Chemical Co.; and GY-260, GY-255 and XB-2615, all produced by Ciba-Geigy Co.

Of the above-mentioned novolak-type epoxy compounds, especially preferred are cresol-novolak-type epoxy compounds.

The unsaturated monocarboxylic acid may include, for example, acrylic acid, methacrylic acid, β-styrylacrylic acid, β-furfurylacrylic acid, crotonic acid, α-cyanocinnamic acid, and cinnamic acid. It may further include anhydrides of saturated or unsaturated dibasic acids, such as phthalic acid, tetrahydrophthalic acid, hexahydrophthalic acid, maleic acid, succinic acid, itaconic acid, chlorendic acid, methylhexahydrophthalic acid, methylendomethylenetetrahydrophthalic acid and methyltetrahydrophthalic acid; and acrylates, such as hydroxyethyl acrylate, hydroxypropyl acrylate, hydroxybutyl acrylate, polyethylene glycol monoacrylate, glycerin diacrylate, trimethylolpropane diacrylate, pentaerythritol triacrylate, dipentaerythritol pentaacrylate and triglycidyl isocyanurate, and methacrylates corresponding to such acrylates. It may still further include semi-esters to be produced by reacting the above-mentioned saturated or unsaturated dibasic acid anhydrides with glycidyl (meth)acrylates in an equimolar ratio in an ordinary manner. These unsaturated monocarboxylic acids may be used herein either singly or as combined.

Of the above-mentioned unsaturated monocarboxylic acids, preferred is acrylic acid.

The unsaturated or saturated polybasic acid anhydride may include, for example, anhydrides of phthalic acid, tetrahydrophthalic acid, hexahydrophthalic acid, maleic acid, succinic acid, itaconic acid, chlorendic acid, methylhexahydrophthalic acid, methylendomethylenetetrahydrophthalic acid, methyltetrahydrophthalic acid, trimellitic acid, pyromellitic acid and benzophenone-tetracarboxylic acid. Of these saturated or unsaturated polybasic acid anhydrides, preferred are tetrahydrophthalic anhydride and hexahydrophthalic anhydride.

The diisocyanate may include, for example, tolylene diisocyanate, xylylene diisocyanate, hydrogenated xylylene diisocyanate, hexamethylene diisocyanate, isophorone diisocyanate, diphenylmethane diisocyanate, toluidine diisocyanate and lysine diisocyanate. Of these diisocyanates, preferred are tolylene diisocyanate and isophorone diisocyanate.

The (meth)acrylate having at least one hydroxyl group in one molecule may include, for example, hydroxyethyl acrylate, hydroxypropyl acrylate, hydroxybutyl acrylate, polyethylene glycol monoacrylate, glycerin diacrylate, trimethylolpropane diacrylate, pentaerythritol triacrylate, dipentaerythritol pentaacrylate, tris(hydroxyethyl) isocyanurate, and methacrylates corresponding to such acrylates. Of these (meth)acrylates, preferred are hydroxyethyl acrylate and pentaerythritol triacrylate.

The unsaturated phenol compound may include, for example, 4'-hydroxychalcone, 2'-hydroxychalcone, and 4,4'-dihydroxychalcone. Of these unsaturated phenol compounds, preferred is 4'-hydroxychalcone.

For the completely esterified or etherified products of the above-mentioned (a) and (b), the ratio of epoxy equivalent/carboxyl equivalent may be from 0.8/1 to 3.3/1, preferably from 0.9/1 to 1.1/1; while for the partially esterified or etherified products thereof, said ratio is preferably from 1.1/1 to 2.5/1.

The esterification and etherification for (a) and (b) may be conducted, for example, in an organic solvent in the presence of a thermal polymerization inhibitor and a catalyst, with stirring at from 70 to 140° C.

In the reaction of the esterified or etherified product, which is produced by said esterification or etherification, with a polybasic acid anhydride at the secondary hydroxyl group of the former, for (a) and (b), the ratio of the acid anhydride equivalent to the secondary hydroxyl equivalent is preferably 0.15 or more, more preferably 0.3 or more. This reaction may be conducted, for example, in an organic solvent in the presence of a thermal polymerization inhibitor and a catalyst, with stirring at from 70 to 120° C.

The reaction product thus obtained preferably has an acid value of from 30 to 160 mg KOH/g, especially preferably from 45 to 120 mg KOH/g. If its acid value is less than 30, the solubility of the reaction product in developers will be unfavorably poor. If, on the other hand, its acid value is more than 160, the alkali resistance and various electric characteristics of the cured composition comprising it are unfavorably poor, or that is, the characteristics of the solder resist of the cured composition are poor. Also preferably, the reaction product has an epoxy retention of not larger than 20%, especially preferably not larger than 15%.

Diisocyanates may be reacted with (meth)acrylates in the presence of known organic solvents and catalysts with stirring at from 30 to 120° C. to give semi-urethane (meth)acrylates. This reaction is preferably conducted with excess (meth)acrylates. The resulting semi-urethane (meth)acrylate may be reacted with any of the above-mentioned etherified or esterified products at the secondary hydroxyl group of the latter, at from 30 to 120° C. to give a photo-curable epoxy resin. In this reaction, the ratio of the isocyanate equivalent to the secondary hydroxyl equivalent is preferably 0.1 or more, especially preferably 0.2 or more.

The reaction product may include allyl compounds, diallyl phthalate prepolymers and/or diallyl isophthalate prepolymers. As such allyl compounds, diallyl phthalate prepolymers and/or diallyl isophthalate prepolymers, for example, mentioned are Daiso Dap and Daiso Indap, both produced by Osaka Soda Co. Of these prepolymers, preferably used herein are those having a mean molecular weight of from 2000 to 30000, more preferably from 5000 to 20000.

The polyfunctional acrylic monomer may include, for example, photosensitive prepolymers, photopolymerizable vinyl monomers, and acrylate monomers or oligomers, which have at least two ethylenic unsaturated bonds in one molecule and which are used as ultraviolet-curable adhesives. As specific examples of such monomers, concretely mentioned are trimethylolpropane triacrylate, glycerin diglycidyl ether diacrylate, glycerin triglycidyl ether triacrylate, pentaerythritol triacrylate, pentaerythritol tetraacrylate, dipentaerythritol pentaacrylate, dipentaerythritol hexaacrylate, isoborneolyl acrylate, cyclopentadiene; and methacrylates corresponding to said acrylates. These polyfunctional acrylic monomers may be used herein either singly or as combined.

In addition, also employable herein are polyfunctional acrylic monomers or oligomers of a general formula:

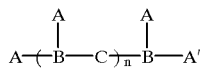

wherein A represents a (meth)acrylic acid residue;
B represents a residue of a polyalcohol, such as 2-ethyl-2-15 hydroxymethyl- 1,3-propanediol or pentaerythritol;
C represents a residue of 3-cyclohexene- 1,2-dicarboxylic acid, 4-cyclohexene-1,2-dicarboxylic acid or the like; and n represents an integer of 1 or 2.

The polyfunctional acrylic monomer content of the visible radiation-curable solder resist composition of the present invention is preferably from 3 to 50 parts by weight, more preferably from 5 to 50 parts by weight, even more preferably from 15 to 40 parts by weight, relative to 100 parts by weight of the composition. If its content is larger than 50 parts by weight, the quality of the film from the composition is unfavorably poor; but if it is smaller than 3 parts by weight, such is also unfavorable since not only the quality of the film from the composition is poor but also the sensitivity of the composition itself is poor.

The resin component may further contain any known thermosetting epoxy resin. The thermosetting epoxy resin may be an epoxy resin having at least two epoxy groups in one molecule, including, for example, trimethylolpropane triglycidyl ether, and trimethylolpropane diglycidyl ether. However, since the thermosetting epoxy resin, if used, shall be dispersed in the visible radiation-curable solder resist composition of the invention, it is preferably solid or semi-solid at room temperature while not dissolving in the photo-curable epoxy resin and the optional component, diluent in the composition. As specific examples of such thermosetting epoxy resins, mentioned are bisphenol S-type epoxy resins, such as EEPS-200 produced by Nippon Kayaku Co.; EPX-30 produced by ACR Co.; and Epiclon EXA-1514 produced by Dai-Nippon Ink And Chemicals Co.; diglycidyl terephthalates such as Blemer-DGT produced by Nippon Oils & Fats Co.; heterocyclic epoxy resins, such as TEPIC produced by Nissan Chemical Co.; and Araldite PT810 produced by Ciba-Geigy Co.; bixylenol-type epoxy resins such as YX-4000 produced by Yuka-Shell Co.; and bisphenol-type epoxy resins such as YL-6056 produced by Yuka-Shell Co. These thermosetting epoxy resins may be used herein either singly or as combined. If desired, any other thermosetting epoxy resins soluble in diluents may be added to the composition of the invention only within the range thereof that does not have any influence on the photosensitivity and the developability of the composition.

The ratio of the photo-curable epoxy resin to the thermosetting epoxy resin, if used, is preferably from 95/5 to 50/50 (by weight), more preferably from 90/10 to 60/40.

The thermosetting epoxy resin for use in the invention is preferably a particulate epoxy resin which is hardly soluble in diluents. If a thermosetting epoxy resin of that type is in the composition, the thermosetting epoxy resin particulates may be enveloped in the photo-curable epoxy resin existing therein, and therefore, when the composition is developed, the thermosetting epoxy resin does not have any influence on the dissolution of the photo-curable epoxy resin but rather may act to prevent thermal fogging of the developed film of the composition, or that is, to improve the developability of the composition.

The particle size of the particulate thermosetting epoxy resin is suitably 50 μm or smaller, preferably 30 μm or smaller. If it is larger than 50 μm, such large particulates will unfavorably roughen the surface of the film of the composition comprising them.

The visible radiation-curable solder resist composition of the present invention further contains a component for promoting photo-polymerization or -crosslinking, said component comprising a photo-reaction initiator, a sensitizing dye and a heterocyclic compound having at least two endocyclic nitrogen atoms.

The photo-reaction initiator may be a compound well known to generate radicals in the presence of light, including, for example, benzoin ether compounds such as isopropylbenzoin ether and isobutylbenzoin ether; ketal compounds such as benzyl methyl ketal and 1-hydroxycyclohexyl phenyl ketone; acetophenone compounds such as acetophenone and 2,2-dimethoxy-2- phenylacetophenone; benzophenone compounds such as 3,3',4,4'-tetra-(t-butylperoxycarbonyl)benzophenone, methyl o-benzoylbenzoate, and benzophenone; thioxanthone compounds such as 2-methylthioxanthone and 2-chlorothioxanthone; organic peroxides such as ketone peroxides and hydroperoxides; triazine compounds such as N-phenylglycine, 2,4,6-tris(trichloromethyl)-1,3,5-triazine, and 2,4-bis(trichloromethyl)-6-phenyl-1,3,5-triazine; allene-iron complexes; and imidazole dimers such as 2,2'-bis(o-chlorophenyl)-4,4', 5,5'-tetraphenyl-1,2'-bisimidazole and 2-(o-chlorophenyl)-4,5-bis(m-methoxyphenyl)-imidazole dimers. These photo-reaction initiators may be used herein either singly or as combined.

The sensitizing dye may be one capable of absorbing visible rays, including, for example, ketocoumarin dyes such as 3,3',4,4'-carbonylbis-7-(diethylamino)coumarin; coumarin dyes such as 3,3'-carbonylbis-7-(diethylamino) coumarin and 3-(2'-benzothiazolyl)-7-N,N-diethylaminocoumarin; thiopyrylium salt dyes such as 4-butoxyphenyl-2,6-diphenylthiopyrylium perchlorate; 2,6-bis(benzylidene)cyclohexanone dyes such as 4-t-butyl-2,6-bis(4'-dimethylaminobenzylidene)cyclohexanone; pyran dyes such as [2-[2-[4-(dimethylamino)phenyl]ethenyl]-6-methyl-4H-pyran-4-ylidene]propanedinitrile; thioxanthene dyes; and xanthene dyes. These sensitizing dyes may be used herein either singly or as combined.

The heterocyclic compound having at least two endocyclic nitrogen atoms may include, for example, triazole compounds such as benzotriazole, 5-methyl-1H-1,2,4-triazole-3-thiol, and 1H-1,2,4-triazole; pyrazole compounds such as pyrazole; triazine compounds such as triazinethiol; and tetrazole compounds such as 1H-tetrazole. These heterocyclic compounds may be used herein either singly or as combined.

The above-mentioned three constituents, the sensitizing dye, the photo-reaction initiator and the heterocyclic compound, may be added to the composition of the invention each in such an amount that is necessary for curing the resin component in the composition when exposed to visible rays.

Concretely, the amount of the sensitizing dye is preferably from 0.01 to 20 parts by weight, more preferably from 0.1 to 10 parts by weight, relative to 100 parts by weight of the visible radiation-curable solder resist composition. If it is larger than 20 parts by weight, the quality of the film of the composition is unfavorably poor; but if it is smaller than 0.01 parts by weight, the sensitivity of the composition is unfavorably low.

The amount of the photo-reaction initiator is preferably from 0.5 to 30 parts by weight, more preferably from 1 to 20 parts by weight, relative to 100 parts by weight of the visible radiation-curable solder resist composition. If it is larger than 30 parts by weight, the quality of the film of the composition is unfavorably poor; but if it is smaller than 0.5 parts by weight, the sensitivity of the composition is unfavorably low.

The amount of the heterocyclic compound is preferably from 0.001 to 20 parts by weight, more preferably from 0.01 to 10 parts by weight, relative to 100 parts by weight of the visible radiation-curable solder resist composition. If it is larger than 20 parts by weight, the quality of the film of the composition is unfavorably poor; but if it is smaller than 0.001 parts by weight, such is also unfavorable since the composition reacts with metals (e.g., copper) constituting wire layers and gives residues after developed.

If desired, the visible radiation-curable solder resist composition of the present invention may additionally contain a diluent and any other additives.

The diluent may include, for example, photo-polymerizable vinyl monomers and organic solvents.

The photo-polymerizable vinyl monomers may include, for example, hydroxyalkyl acrylates such as 2-hydroxyethyl acrylate and 2-hydroxybutyl acrylate; mono- or di-acrylates of glycols, such as ethylene glycol, methoxytetraethylene glycol, polyethylene glycol, and propylene glycol; acrylamides such as N,N-dimethylacrylamide and N-methylolacrylamide; aminoalkyl acrylates such as N,N-dimethylaminoethyl acrylate; polyalcohols, such as hexanediol, trimethylolpropane, pentaerythritol, dipentaerythritol, and trishydroxyethyl isocyanurate, as well as polyacrylates of adducts of such polyalcohols with ethylene oxide or propylene oxide; phenols, such as phenoxyacrylates and bisphenol A diacrylate, as well as acrylates of adducts of such phenols with ethylene oxide or propylene oxide; acrylates of glycidyl ethers, such as glycerin diglycidyl ether, trimethylolpropane triglycidyl ether, and triglycidyl isocyanurate; melamine acrylates; and methacrylates corresponding to said acrylates.

The organic solvents may include, for example, ketones such as ethyl methyl ketone and cyclohexanone; aromatic hydrocarbons such as toluene, xylene, and tetramethylbenzene; glycol ethers such as methyl cellosolve, butyl cellosolve, methyl carbitol, butyl carbitol, propylene glycol monomethyl ether; dipropylene glycol monoethyl ether, and triethylene glycol monoethyl ether; esters, for example, such as ethyl acetate, butyl acetate, and acetates of the above-mentioned glycol ethers; alcohols such as ethanol, propanol, ethylene glycol, and propylene glycol; aliphatic hydrocarbons such as octane and decane; and petroleum solvents such as petroleum ether, petroleum naphtha, and solvent naphtha.

Of these diluents, preferred are those which are well miscible with photo-curable epoxy resins and which do not dissolve particulate thermosetting epoxy resins. The above-mentioned diluents may be used herein either singly or as combined.

The amount of the diluent, if used, in the visible radiation-curable solder resist composition of the invention is preferably from 20 to 300 parts by weight, more preferably from 30 to 200 parts by weight, relative to 100 parts by weight of the composition.

As other optional additives, the composition of the invention may contain any of epoxy-curing promoters; known inorganic fillers, such as barium sulfate, silicon oxide, talc, clay, and calcium carbonate; defoaming agents; adhesiveness improvers; leveling agents; and polymerization inhibitors such as hydroquinone and tert-butylcatechol.

Japanese Patent Application Laid-Open No. 1-141904 and Japanese Patent Publication No. 1-54390 disclose ultraviolet-curable solder resist compositions comprising a photo-curable epoxy resin having a novolak resin skeleton and optionally containing a diluent and other additives. These compositions disclosed therein can be used as the starting materials for the visible radiation-curable solder resist compositions of the present invention. In addition to these, also employable is a commercially-available product of PSR-4000 (produced by Taiyo Ink Manufacturing Co.) as the starting materials for the visible radiation-curable solder resist compositions of the present invention.

Briefly, when a photo-reaction initiator, a sensitizing dye, a heterocyclic compound and a polyfunctional acrylic monomer such as those mentioned hereinabove are added to any of the ultraviolet-curable solder resist compositions disclosed in said laid-open patent application or patent publication or the above-mentioned, commercially-available product, then visible radiation-curable solder resist compositions of the present invention can be obtained. Where the above-mentioned ultraviolet-curable solder resist compositions are used as the starting materials in the invention, it is possible to provide visible radiation-curable solder resist compositions of the invention which are sensitive to such a degree that they can be subjected to scanning exposure to visible layers to give solder resist patterns having the physical characteristics and thermal characteristics intrinsic to those of the solder resist patterns to be obtained from said ultraviolet-curable solder resist compositions.

The visible radiation-curable solder resist composition of the present invention may optionally contain any of the ultraviolet-sensitive photo-polymerization initiators disclosed in the above-mentioned Japanese Patent Application No. 1-141904 and Japanese Patent Publication No. 1-54390.

The visible radiation-curable solder resist composition of the present invention may be produced by mixing the above-mentioned components in known stirrers.

Now, the formation of solder resist patterns from the visible radiation-curable solder resist composition of the present invention is referred to hereinunder.

First, the visible radiation-curable solder resist composition of the invention is first applied onto a substrate. The thickness of the composition to be coated on a substrate is preferably from 10 to 70 μm. The substrate may include so-called, printed circuit boards, which have copper or the like wiring layers on one surface or both surfaces of bases, such as paper/phenolic resin bases, paper/polyester resin bases, paper/epoxy resin bases, glass/epoxy resin bases, glass/polyimide resin bases, glass/BT resin bases, flexible polyimide bases, flexible polyester bases, composite bases, ceramic bases, and heat-resistant, thermoplastic resin bases. The printed circuit boards may have through-holes.

Next, the thus-coated substrate is exposed to visible rays only in the region where a solder resist pattern is desired to be formed, whereby the visible radiation-curable solder resist composition in the exposed region is cured. The visible rays to be used for the exposure thereto of the visible radiation-curable solder resist composition are preferably those from argon lasers.

Next, the visible radiation-curable solder resist composition on the substrate is developed, whereby the composition in the non-exposed region is dissolved and removed from the substrate. For the development, employable is any known means. For this, however, preferably used is an aqueous alkaline solution having a pH of 8 or more. The aqueous alkaline solution may be an aqueous solution of sodium carbonate, sodium hydroxide or the like.

Next, the thus-developed substrate is heated to give a solder resist pattern thereon. The heat treatment is for the purpose of so-called post-curing, and the temperature for this is preferably from 120 to 180° C. The thus-formed solder resist pattern generally has a thickness of from 5 to 50 μm.

Though not clear, the reasons why the visible radiation-curable solder resist composition can be provided herein may be as follows:

(1) The heterocyclic compound in the composition may interact with the sensitizing dye therein to change the excited condition of the sensitizing dye, whereby the sensitizing activity of the sensitizing dye is amplified to have an extremely increased sensitivity while the resolution power of the pattern formed is also amplified.

(2) Since the heterocyclic compound has a high ability to form chelates with metal (copper etc.) ions, it can prevent the reaction between the metal ions that may be released from the substrate after the substrate has been coated with the visible radiation-curable solder resist composition, and ionic groups, such as carboxyl groups, existing in said solder resist composition. Since the heterocyclic compound thus prevents the increase in the molecular weight of the resin precipitate to be formed through chelating with metal ions and further prevents the photo-curable epoxy resin itself from being crosslinked, the solubility of the non-exposed area in developers in patterning is enhanced, resulting in that the difference in the solubility between the exposed area and the non-exposed area is enlarged to thereby amplify the resolving power of the solder resist.

EXAMPLES

The following Examples 1 to 17 are to demonstrate the present invention, which will be described in detail hereinunder. In these, "parts" and "%" are all by weight.

Example 1

Herein used was PSR-4000 (ultraviolet-curable solder resist composition, produced by Taiyo Ink Manufacturing Co.) containing a photo-curable epoxy resin having a novolak resin skeleton. It is believed that the content of the photo-curable epoxy resin having a novolak resin skeleton in PSR-4000 is from about 30 to about 60%.

This ultraviolet-curable solder resist composition was mixed with the following components to prepare a visible radiation-curable solder resist composition.

PSR-4000 (ultraviolet-curable solder resist composition) 20.0 parts

Photo-reaction initiator; this is a benzophenone-type reaction initiator, 3,3',4,4'-tetra-(t-butylperoxycarbonyl)benzophenone, having the following chemical formula:

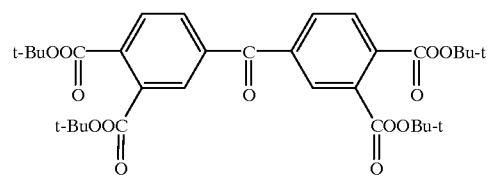

1.0 part

Sensitizing dye; this is a ketocoumarin dye, 3,3'-carbonylbis-7-(diethylamino)coumarin, having the following chemical formula:

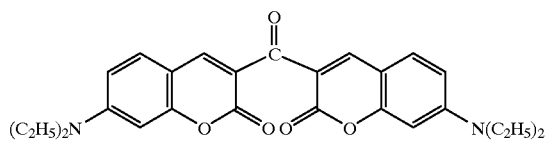

0.2 parts

FIG. 1 shows a curve of the spectral sensitivity of this sensitizing dye.

Heterocyclic compound, benzotriazole 0.2 parts

Polyfunctional acrylic monomer, acrylate monomer of dipentaerythritol pentaacrylate 5.0 parts Using this visible radiation-curable solder resist composition, a solder resist pattern was formed in the manner mentioned below.

First, the visible radiation-curable solder resist composition was applied onto the entire surface of a copper-coated, printed circuit board having through-holes according to a screen-printing method, and then dried. Next, an overcoating agent as prepared by dissolving a copolymer of vinyl acetate and polyvinyl alcohol in water was applied over the surface of the visible radiation-curable solder resist composition, and then dried. The coating of said overcoating agent is to prevent the visible radiation-curable solder resist composition from reacting with oxygen in air.

Next, the thus-coated board was exposed to an argon laser beam having a wavelength of 488 nm and having a beam diameter of 50 μm for direct patterning. The exposure amount was 4 mJ/cm$^2$.

The board was then developed with a developer of an aqueous solution of 1% sodium carbonate according to spray-development, and then post-cured in a hot-air circulating furnace at 150° C. for 30 minutes, whereby formed was a solder resist pattern of the solder resist composition.

Example 2

The following components were mixed with 20.0 parts of the same ultraviolet-curable solder resist composition as that used in Example 1, to prepare a visible radiation-curable solder resist composition.

Photo-reaction initiator; this is an imidazole dimer-type initiator, 2,2'-bis(o-chlorophenyl)-4,4',5,5'-tetraphenyl-1,2'-bisimidazole 2.0 parts Sensitizing dye; 2,2,4-(dimethylamino)phenylethenyl-6-methyl-4H-pyran-4-ylidenepropanedinitrile 0.5 parts Heterocyclic compound; benzotriazole 0.8 parts Polyfunctional acrylic monomer; this is an acrylate monomer, trimethylolpropane triacrylate 8.0 parts Using this visible radiation-curable solder resist composition, the same substrate as that used in Example 1 was coated, exposed, developed and post-cured in the same manner as in Example 1, except that the exposure amount was 6 mJ/cm$^2$ and that the temperature in the hot-air circulating furnace was 180° C. Thus was formed herein a solder resist pattern on the substrate.

Example 3

The following components were mixed with 20.0 parts of the same ultraviolet-curable solder resist composition as that used in Example 1, to prepare a visible radiation-curable solder resist composition.

Photo-reaction initiator; this is a benzophenone-type initiator, 3,3',4,4'-tetra-(t-butylperoxycarbonyl) benzophenone 1.0 part Sensitizing dye; this is a 2,6-bis(benzylidene) cyclohexanone dye, 4-t-butyl-2,6-bis(4'-dimethylaminobenzylidene)cyclohexanone 0.2 parts Heterocyclic compound; benzotriazole 0.2 parts Polyfunctional acrylic monomer; this is an acrylate monomer, dipentaerythritol pentaacrylate 5.0 parts Using this visible radiation-curable solder resist composition, the same substrate as that used in Example 1 was coated, exposed, developed and post-cured in the same manner as in Example 1, except that the beam diameter of the argon laser beam was 80 μm, that the exposure amount was 6 mJ/cm$^2$ and that the temperature in the hot-air circulating furnace was 170° C. was used as the developer. Thus was formed herein a solder resist pattern on the substrate.

Example 4

The following components were mixed with 20.0 parts of the same ultraviolet-curable solder resist composition as that used in Example 1, to prepare a visible radiation-curable solder resist composition.

Photo-reaction initiator; this is a triazine compound, 2,4,6-tris(trichloromethyl)-1,3,5-triazine 5.0 parts Sensitizing dye; this is a thiopyrylium salt dye, 4-butoxyphenyl-2,6-diphenylthiopyrylium perchlorate 0.5 parts Heterocyclic compound; benzotriazole 0.1 parts Polyfunctional acrylic monomer; this is an acrylate monomer, trimethylolpropane triacrylate 10.0 parts Using this visible radiation-curable solder resist composition, the same substrate as that used in Example 1 was coated, exposed, developed and post-cured in the same manner as in Example 1, except that the exposure amount was 10 mJ/cm$^2$, that the temperature in the hot-air circulating furnace was 150° C. and that the post-curing time was 40 minutes. Thus was formed herein a solder resist pattern on the substrate.

Example 5

The same process comprising coating, exposure, development and post-curing as in Example 3 was repeated herein, except that the exposure amount was 5 mJ/cm$^2$ and that the temperature in the hot-air circulating furnace was 160° C. Even under these conditions, formed was a solder resist pattern.

Example 6

The same process as in Example 4 was repeated herein, except that the post-curing time was 30 minutes. Even under these conditions, formed was a solder resist pattern.

Example 7

The same process as in Example 1 was repeated herein to form solder resist patterns, except that the amount of the photo-reaction initiator in the visible radiation-curable solder resist composition was varied to 30.0 parts and 0.5 parts.

Where 30.0 parts of the initiator was used, the quality of the dried film of the solder resist composition was visually poor, and the quality of the film of the developed pattern was also visually poor.

Where 0.5 parts of the initiator was used, all patterns were dissolved by the development since the sensitivity of the composition was low.

Example 8

The same process as in Example 1 was repeated herein to form solder resist patterns, except that the amount of the sensitizing dye in the visible radiation-curable solder resist composition was varied to 20.00 parts and 0.01 parts.

Where 20.00 parts of the sensitizing dye was used, the quality of the dried film of the solder resist composition was visually poor, and the quality of the film of the developed pattern was also visually poor. In addition, in this case, it was observed that the sensitizing dye still remained in the pattern.

Where 0.01 parts of the sensitizing dye was used, all patterns were dissolved by the development since the sensitivity of the composition was low.

Example 9

The same process as in Example 1 was repeated herein to form solder resist patterns, except that the amount of the heterocyclic compound in the visible radiation-curable solder resist composition was varied to 20.00 parts and 0.001 parts.

Where 20.00 parts of the heterocyclic compound was used, the quality of the dried film of the solder resist composition was visually poor, and the quality of the film of the developed pattern was also visually poor. In addition, in this case, residues were observed in the non-exposed area.

Where 0.001 parts of the heterocyclic compound was used, residues were observed in the non-exposed area since the ability of the compound to prevent the reaction with copper was poor.

Example 10

The same process as in Example 1 was repeated herein to form solder resist patterns, except that the amount of the polyfunctional acrylic monomer in the visible radiation-curable solder resist composition was varied to 50.00 parts and 3.00 parts.

Where 50.00 parts of the monomer was used, the cured film was greatly shrunk and its quality was poor.

Where 3.00 parts of the monomer was used, the quality of the film formed was poor. In addition, since the sensitivity of the composition was poor, the pattern partly dissolved in the developer.

Example 11

One equivalent of a cresol-novolak-type epoxy resin having 7 phenol nucleus residues on average in one molecule and having epoxy groups to have an epoxy equivalent of 217 was reacted with 1.05 equivalents of acrylic acid. The resulting reaction product was further reacted with 0.67 equivalents of tetrahydrophthalic anhydride in a solvent of phenoxyethyl acrylate, according to a known method. The thus-obtained photo-curable epoxy resin having a novolak resin skeleton was a viscous liquid mixture containing 35 parts of phenoxyethyl acrylate. The mixture had an acid value of 63.4 mg KOH/g. 8.0 parts of this resin was mixed with the following components to prepare a visible radiation-curable solder resist composition.

Photo-reaction initiator; this is a benzophenone-type initiator, 3,3',4,4'-tetra-(t-butylperoxycarbonyl)benzophenone 1.0 part Sensitizing dye; this is a ketocoumarin dye, 3,3'-carbonylbis-7-(diethylamino)coumarin 0.2 parts Heterocyclic compound; benzotriazole 0.2 parts Polyfunctional acrylic monomer; this is an acrylate monomer, dipentaerythritol pentaacrylate 5.0 parts Thermosetting epoxy resin; trimethylolpropane triglycidyl ether 3.0 parts Diluent; this is a photo-polymerizable vinyl monomer, 2-hydroxyethyl acrylate 3.0 parts Epoxy curing promoter; 1-benzyl-2-methylimidazole 0.2 parts Leveling agent; "Modaflow" 0.2 parts Inorganic filler; barium sulfate 5.0 parts Using this composition, the same process comprising coating, exposure, development and post-curing as in Example 1 was repeated herein to form a solder resist pattern on the substrate.

Example 12

The following components were mixed to prepare a visible radiation-curable solder resist composition.

Photo-curable epoxy resin prepared in Example 11 6.0 parts

Photo-reaction initiator; this is an imidazole dimer-type initiator, 2,2'-bis(o-chlorophenyl)-4,4',5,5'-tetraphenyl-1,2'-bisimidazole 2.0 parts Sensitizing dye; 2,2,4-(dimethylamino)phenylethenyl-6-methyl-4H-pyran-4-ylidenepropanedinitrile 0.5 parts Heterocyclic compound; benzotriazole 0.8 parts Polyfunctional acrylic monomer; this is an acrylate monomer, trimethylolpropane triacrylate 10.0 parts Diluent; this is a photo-polymerizable vinyl monomer, N-vinylpyrrolidone 3.0 parts Epoxy curing promoter; 2-phenyl-4-methyl-5-hydroxymethylimidazole 0.2 parts Leveling agent; "Modaflow" 0.2 parts Inorganic filler; calcium carbonate 5.0 parts Glycidyl ether-type epoxy compound; Epicote 828 1.4 parts Thermosetting epoxy resin; glycerin glycidyl ether 1.6 parts Using this composition, the same process comprising coating, exposure, development and post-curing as in Example 1 was repeated, except that the exposure amount was 6 mJ/cm$^2$ and that the temperature in the hot-air circulating furnace was 180° C. Thus was formed herein a solder resist pattern on the substrate.

Example 13

One equivalent of a cresol-novolak-type epoxy resin having 7 phenol nucleus residues on average in one molecule and having epoxy groups to have an epoxy equivalent of 217 was reacted with 1.05 equivalents of acrylic acid. The resulting reaction product was further reacted with 0.95 equivalents of tetrahydrophthalic anhydride in a solvent of phenoxyethyl acrylate, according to a known method. The thus-obtained photo-curable epoxy resin having a novolak resin skeleton was diluted with cellosolve acetate to make it have a nonvolatile content of 65%. 11.0 parts of the thus-diluted resin was mixed with the following components to prepare a visible radiation-curable solder resist composition.

Photo-reaction initiator; this is a benzophenone-type initiator, 3,3',4,4'-tetra-(t-butylperoxycarbonyl)benzophenone 1.0 part Sensitizing dye; this is a 2,6-bis(benzylidene)cyclohexanone dye, 4-t-butyl-2,6-bis(4'-dimethylaminobenzylidene)cyclohexanone 0.2 parts Heterocyclic compound; benzotriazole 0.8 parts Polyfunctional acrylic monomers:

Trimethylolpropane triacrylate 5.0 parts

Pentaerythritol triacrylate 0.8 parts

Trimethylolpropane triacrylate 0.8 parts

Epoxy curing promoter; 2-phenyl-4-methyl-5-hydroxymethylimidazole 0.2 parts

Inorganic filler; calcium carbonate 3.0 parts

Glycidyl ether-type epoxy resin; Epicote 828 1.4 parts

Thermosetting epoxy resin; trimethylolpropane triglycidyl ether 1.6 parts

Bisphenol S-type epoxy resin; "Epiclon EXA-1514" 1.0 part

Defoaming agent; "AC-300" 0.2 parts

Using this composition, the same process comprising coating, exposure, development and post-curing as in Example 1 was repeated herein, except that the beam diameter of the argon laser beam was 80 μm, that the exposure amount was 5 mJ/cm² and that the temperature in the hot-air circulating furnace was 160° C. Thus was formed herein a solder resist pattern on the substrate.

Example 14

The following components were mixed to prepare a visible radiation-curable solder resist composition.

Photo-curable epoxy resin prepared in Example 13 11.0 parts

Photo-reaction initiator; this is a triazine compound, 2,4,6-tris(trichloromethyl)-1,3,5-triazine 5.0 parts Sensitizing dye; this is a thiopyrylium salt dye, 4-butoxyphenyl-2,6-diphenylthiopyrylium perchlorate 0.5 parts Heterocyclic compound; benzotriazole 0.1 parts Polyfunctional acrylic monomer; this is an acrylate monomer, trimethylolpropane triacrylate 10.0 parts Epoxy curing promoter; 2-phenyl-4-methylimidazole 0.2 parts Inorganic filler; talc 4.0 parts Glycidyl ether-type epoxy compound; Epicote 1001 3.0 parts Thermosetting epoxy resin; trimethylolpropane triglycidyl ether 1.0 part Defoaming agent; "AC-300" 0.2 parts Using this composition, the same process comprising coating, exposure, development and post-curing as in Example 1 was repeated, except that the exposure amount was 10 mJ/cm² and that the post-curing time was 50 minutes. Thus was formed herein a solder resist pattern on the substrate.

Example 15

Using herein the visible radiation-curable solder resist composition of Example 13, the same process comprising coating, exposure, development and post-curing as in Example 1 was repeated, except that 5.0 parts of a polyfunctional acrylic monomer, dipentaerythritol pentaacrylate was used herein, to which had been added 6.0 parts of an acrylate monomer mentioned below. Thus was formed a solder resist pattern on the substrate.

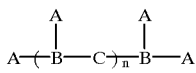

A: acrylic acid
B (polyalcohol):
  2-ethyl-2-hydroxymethyl-1,3-propanediol
C (polybasic acid):
  3-cyclohexene-1,2-dicarboxylic acid
  4-cyclohexene-1,2-dicarboxylic acid
n: 1 or 2

Example 16

Using herein the visible radiation-curable solder resist composition of Example 13, the same process comprising coating, exposure, development and post-curing as in Example 1 was repeated, except that 0.2 parts of the heterocyclic compound, benzotriazole in Example 13 was replaced by 0.4 parts of 1H-tetrazole. Thus was formed herein a solder resist pattern on the substrate.

Example 17

Using herein the visible radiation-curable solder resist composition of Example 14, the same process comprising coating, exposure, development and post-curing as in Example 1 was repeated, except that 0.1 parts of the heterocyclic compound, benzotriazole in Example 14 was replaced by 1.0 part of 5-methyl-1H-1,2,4-triazole-3-thiol. Thus was formed herein a solder resist pattern on the substrate.

The visible radiation-curable solder resist composition of the present invention is characterized in that it comprises, as the resin component, a photo-curable epoxy resin having a novolak resin skeleton and a polyfunctional acrylic monomer, and, as the component for promoting photo-polymerization or -crosslinking, a photo-reaction initiator, a sensitizing dye and a heterocyclic compound having at least two endocyclic nitrogen atoms, while optionally containing a diluent and any other additives.

Therefore, the composition is sensitive in such a degree that it can be exposed to visible rays, and the composition is developable with an aqueous alkaline solution.

The method of the present invention for forming solder resist patterns is characterized in that it comprises applying the above-mentioned visible radiation-curable solder resist composition onto a substrate, exposing the substrate to visible rays only in the region in which a solder resist pattern is to be formed to thereby cure the solder resist composition in the thus-exposed region, then developing it to thereby dissolve the solder resist composition existing in the non-exposed region to remove it from said region, and thereafter heat-treating it to form a solder resist pattern on the substrate.

Therefore, the solder resist film to be formed according to the method of the present invention has high quality and can be patterned into a solider resist pattern with no residues.

What is claimed is:

1. An argon laser ray-curable solder resist composition which comprises resin component, a component for promoting photo-polymerization or photo-crosslinking, and optionally a diluent and additives, the resin component comprising a photo-curable epoxy resin having a novolak resin skeleton and a polyfunctional acrylic monomer, and the component for promoting photo-polymerization or photo-crosslinking comprising (a) a photo-reaction initiator comprising at least one selected from the group consisting of acetophenone compounds, benzophenone compounds, organic peroxides, and imidazole dimers; (b) a sensitizing dye comprising at least one selected from the group consisting of ketocoumarin dyes, coumarin dyes, 2,6-bis(benzylidene)cyclohexanone dyes, and pyran dyes; and (c) a heterocyclic compound having at least two endocyclic nitrogen atoms where the heterocyclic compound comprises at least one selected from the group consisting of triazole compounds, triazine compounds, and tetrazole compounds.

2. An argon laser ray-curable solder resist composition as claimed in claim 1, wherein the polyfunctional acrylic monomer is present in an amount of from 5 to 50 parts by weight relative to 100 parts by weight of the composition.

3. An argon laser ray-curable solder resist composition as claimed in claim 1, wherein the photo-reaction initiator is present in an amount of from 0.5 to 30 parts by weight relative to 100 parts by weight of the composition.

4. An argon laser ray-curable solder resist composition as claimed in claim 1, wherein the sensitizing dye is present in an amount of from 0.01 to 20 parts by weight relative to 100 parts by weight of the composition.

5. An argon laser ray-curable solder resist composition as claimed in claim 1, wherein the heterocyclic compound is present in an amount of from 0.001 to 20 parts by weight relative to 100 parts by weight of the composition.

6. An argon laser ray-curable solder resist composition as claimed in claim 1, wherein the resin component includes particles of a thermosetting epoxy resin.

7. An argon laser ray-curable solder resist composition as claimed in claim 6, wherein the particles of the thermosetting epoxy resin have a particle size of not larger than 50 µm.

8. An argon laser ray-curable solder resist composition as claimed in claim 1, additionally containing at least one selected from the group consisting of epoxy resin-curing agents and inorganic fillers.

9. An argon laser ray-curable solder resist composition as claimed in claim 1, wherein the polyfunctional acrylic monomer comprises at least one selected from the group consisting of photosensitive prepolymers, photopolymerizable vinyl monomers, acrylate monomers and aceylate oligomers, which have at least two ethylenic unsaturated bonds in one molecule.

10. A method for forming solder resist patterns, which comprises applying the visible radiation-curable solder resist composition of claim 1 onto a substrate, exposing the substrate to visible rays only in the region in which a solder resist pattern is to be formed to thereby cure the solder resist composition in the thus-exposed region, then developing the solder resist composition to thereby dissolve the solder resist composition existing in the non-exposed region to remove the solder resist composition and thereafter heat-treating the solder resist composition to form a solder resist pattern on the substrate.

11. A visible radiation-curable solder resist composition which comprises resin component, a component for promoting photo-polymerization or photo-crosslinking, and optionally a diluent and additives, the resin component comprising particles of a photo-curable thermosetting epoxy resin having a novolak resin skeleton and having a particle size of not larger than 50 µm and a polyfunctional acrylic monomer, and the component for promoting photo-polymerization or photo-crosslinking comprising (a) a photo-reaction initiator; (b) a sensitizing dye comprising at least one selected from the group consisting of ketocoumarin dyes, coumarin dyes, thioxanthene dyes, xanthene dyes, thiopyrylium salt dyes, 2,6-bis(benzylidene)cyclohexanone dyes, and pyran dyes; (c) and a heterocyclic compound having at least two endocyclic nitrogen atoms where the heterocyclic compound comprises at least one selected from the group consisting of triazole compounds, pyrazole compounds, triazine compounds, and tetrazole compounds.

* * * * *